(12) United States Patent
Grover et al.

(10) Patent No.: US 9,177,637 B1
(45) Date of Patent: Nov. 3, 2015

(54) WIDE VOLTAGE RANGE HIGH PERFORMANCE SENSE AMPLIFIER

(71) Applicant: STMicroelectronics International N.V., Amsterdam (NL)

(72) Inventors: Anuj Grover, New Delhi (IN); Gangaikondan Subramani Visweswaran, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 14/472,166

(22) Filed: Aug. 28, 2014

(51) Int. Cl.
  *G11C 11/00* (2006.01)
  *G11C 11/419* (2006.01)
  *G11C 7/06* (2006.01)

(52) U.S. Cl.
  CPC ............... *G11C 11/419* (2013.01); *G11C 7/06* (2013.01)

(58) Field of Classification Search
  CPC ............ G11C 5/06; G11C 7/06; G11C 11/40; G11C 11/413; G11C 11/419
  USPC .................... 365/72, 154, 190, 203, 205, 207
  See application file for complete search history.

(56) References Cited

U.S. PATENT DOCUMENTS

| | | | | |
|---|---|---|---|---|
| 6,754,121 B2 * | 6/2004 | Worley | ................... | G11C 7/065 365/154 |
| 6,917,551 B2 * | 7/2005 | Jeong | .................. | G11C 11/4091 365/149 |
| 7,443,749 B2 * | 10/2008 | Forbes | ............... | G11C 11/4091 365/149 |
| 8,144,537 B2 * | 3/2012 | Mishra | ..................... | G11C 7/02 365/203 |

* cited by examiner

*Primary Examiner* — Tan T Nguyen
(74) *Attorney, Agent, or Firm* — Seed IP Law Group PLLC

(57) ABSTRACT

A dual rail SRAM array includes a plurality of columns of memory cells each coupled between two bit lines. A sense amplifier is coupled between each pair of bit lines. Capacitors are positioned between the sense amplifier outputs and the bit lines, thereby separating the sense amplifier from the bit lines. The memory cells are powered with an array supply voltage. The sense amplifier is powered with a peripheral supply voltage. During a read operation of the memory array, the bit lines are precharged to the array supply voltage. The sense amplifier is precharged to the peripheral supply voltage or to an intermediate voltage.

19 Claims, 8 Drawing Sheets

FIG.2 *(Prior Art)*

WIDE VOLTAGE RANGE HIGH PERFORMANCE SENSE AMPLIFIER

BACKGROUND

1. Technical Field

The present disclosure relates to the field of sense amplifiers for memory arrays. The present disclosure relates more particularly to the field of sense amplifiers in dual rail SRAM arrays.

2. Description of the Related Art

Memory devices typically include an array of memory cells. The array of memory cells generally includes word lines and bit lines used to select individual memory cells or groups of memory cells for reading, writing, or erasing operations. One or more sense amplifiers are typically coupled to the bit lines. The sense amplifiers amplify a voltage difference in a memory cell to aid in read processes of the memory cell.

Memory devices also include peripheral circuitry coupled to the array of memory cells. The peripheral circuitry can include control circuitry, addressing circuitry such as row and column decoders, and I/O circuitry.

In some applications it is desirable to reduce the supply voltage of the peripheral circuitry to as low a level as possible in order to reduce the power consumed by the memory device. In other devices, it is desirable to have a somewhat higher supply voltage to meet high-performance demands of the peripheral circuitry. Thus, there is a somewhat wide range of useful peripheral supply voltages depending on the specific applications of a particular memory device.

However, the memory cells of the memory array sometimes have stricter supply voltage limitations. This is because the preferred operating voltage for some memory cells is confined to a somewhat narrow range. To accommodate the needs of both the memory cells and the peripheral circuitry, memory devices often include a first supply voltage for the peripheral circuitry and a second supply voltage for the array of memory cells.

FIG. 1 is a block diagram of a known memory device 20. The memory device 20 includes an array 22 of memory cells, a bit line precharge circuit 24 coupled to the array 22, I/O circuitry 26 coupled to the array 22, decoders 28 coupled to the array 22. The memory device 20 further includes control circuitry 30 coupled to the I/O circuitry 26, decoders 28, and bit line precharge circuit 24. The bit line precharge circuit 24, I/O circuitry 26, control circuitry 30, and decoders 28 all receive a peripheral supply voltage $V_{DDP}$ suited to the peripheral circuitry. The memory array 22 is powered by an array supply voltage $V_{DDA}$ in accordance with the desired performance of the memory cells of the memory array. The array supply voltage $V_{DDA}$ is different from the peripheral supply voltage $V_{DDP}$.

When data is to be read from or written to the array 22, the control circuitry 30 provides address data to the decoders 28. The decoders 28 decode the address data and select the correct memory cells to be read from or written to. The control circuitry 30 also controls the I/O circuitry 26 so that the proper data can be written to the memory cells or so the data can be read from the memory cells.

FIG. 2 is a schematic diagram of a portion of the array 22 of the known dual rail Static Random Access Memory (SRAM) device 20. The dual rail SRAM memory device 20 includes an SRAM memory cell 32 coupled between two bit lines BL, $BL_B$. The bit lines BL, $BL_B$ extend between the peripheral supply voltage $V_{DDP}$ and the I/O circuitry 26. A sense amplifier 36 is coupled to the I/O circuitry 26 and to the bit lines BL, $BL_B$. A sense amplifier precharge circuit 34 is coupled to the sense amplifier 36.

The memory cell 32 includes PMOS transistors P1, P2 and NMOS transistors N1-N4. Transistors P1 and N1 form a first inverter. Transistors P2, N2 form a second inverter. The gates of the transistors P1 and N1 are coupled together and comprise the input of the first inverter. The source of the transistor P1 is coupled to the array supply voltage $V_{DDA}$. The source of the transistor N1 is coupled to ground. The drain terminals of the transistors P1 and N1 are coupled together and comprise the output $V_{out}$ of the first inverter. The gates of the transistors P2 and N2 are coupled together and comprise the input of the second inverter. The source of the transistor P2 is coupled to the array supply voltage $V_{DDA}$. The source of the transistor N2 is coupled to ground. The drain terminals of the transistors P2 and N2 are coupled together and comprise the output $V_{outB}$ of the second inverter.

The first and second inverters are cross coupled together in a latch configuration such that the output $V_{out}$ of the first inverter is coupled to the input of the second inverter. The output $V_{outB}$ of the second inverter is coupled to the input of the first inverter. This ensures that the output $V_{out}$ of the first inverter will be the logical opposite of the output $V_{outB}$ of the second inverter and vice versa. Thus, if the output $V_{out}$ of the first inverter is at ground, the output $V_{outB}$ of the second inverter is at $V_{DDA}$. If the output $V_{out}$ of the first inverter is at $V_{DDA}$, the output $V_{outB}$ of the second inverter is at ground. The output $V_{out}$ of the first inverter is coupled to the bit line BL via an access transistor N3. The output $V_{outB}$ is of the second inverter is coupled to the bit line $BL_B$ via an access transistor N4. The access transistors N3 and N4 are coupled to a word line WL and are enabled when an enable signal is present on the word line WL.

The sense amplifier 36 also includes two cross coupled inverters. The first sense amplifier inverter includes the transistors P3 and N5. The second sense amplifier inverter includes the transistors P4 and N6. The output of the first sense amplifier inverter is $SA_{out}$. The output of the second sense amplifier inverter is $SA_{outB}$. The first and second sense amplifier outputs are coupled to the bit lines BL and $BL_B$ via access transistors P8 and P9 and to I/O circuitry 26. The sources of the transistors N5 and N6 are coupled to ground via the access transistor N7. The transistors P8 and P9 are enabled when a sense amplifier enable signal $SA_{en}$ is low. The transistor N7 is enabled when the sense amplifier enable signal $SA_{en}$ is high.

The sense amplifier precharge circuit 34 includes three precharge transistors P5, P6, and P7 each having their gates coupled together. The source terminals in the transistors P6 and P7 are connected to $V_{DDP}$. The drain terminal of the transistor P6 is coupled to the first sense amplifier output $SA_{out}$. The drain terminal of the transistor P7 is coupled to the second sense amplifier output $SA_{outB}$. The transistors P5, P6, and P7 are enabled when the precharge enable signal Pch is low, forcing $SA_{out}$ and $SA_{outB}$ to the same voltage $V_{DDP}$.

An example of a read cycle of the memory cell 32 will now be provided. In this example, a binary "1" is stored in the memory cell 32. This means that the first memory cell output $V_{out}$ is at $V_{DDA}$ while the second memory cell output $V_{outB}$ is at ground.

When data is to be read from the memory cell 32, a reset phase is initiated in which both bit lines BL and $BL_B$ are precharged to the peripheral voltage $V_{DDP}$ by enabling the transistors N10 and N11 via the bit line enable signal $BL_{en}$. During the reset phase, the precharge enable signal Pch is maintained at ground, thereby precharging $SA_{out}$, $SA_{outB}$ to the peripheral supply voltage $V_{DDP}$. During the reset phase $SA_{en}$ is at ground. Thus, during the reset phase the transistors P8 and P9 are enabled while the transistor N7 is off.

After the bit lines BL, $BL_B$ and the sense amplifier outputs $SA_{out}$, $SA_{outB}$ are precharged to the peripheral supply voltage $V_{DDP}$, the word line WL goes high and the transistors N3 and N4 are enabled. When WL goes high, Pch goes high and $BL_{en}$ goes low, disabling the transistors P5, P6, P7, N10, and N11. The bit lines BL, $BL_B$ and the sense amplifier outputs $SA_{out}$ and $SA_{outB}$ are decoupled from the peripheral supply voltage source $V_{DDP}$. When the word line WL first goes high, $SA_{en}$ is still at ground. Thus, the transistors P8 and P9 are still enabled and the transistor N7 is still off when the word line WL first goes high.

With the transistors N3 and N4 enabled, the outputs $V_{out}$, $V_{outB}$ of the memory cell 32 are connected to the bit lines BL and $BL_B$ respectively. Because $V_{out}$ is at the array potential $V_{DDA}$, the voltage on the bit line $BL_B$ begins to increase toward $V_{DDA}$. Because $V_{outB}$ is at ground, the voltage on the bit line $BL_B$ begins to decrease toward ground. Because BL is coupled to $SA_{out}$ via the transistor P8, $SA_{outB}$ begins to increase toward $V_{DDA}$. Because $BL_B$ is coupled to $SA_{outB}$ via transistor P9, $SA_{outB}$ begins to decrease toward ground. Thus a differential voltage appears across $SA_{out}$ and $SA_{outB}$.

A short time after WL is enabled, $SA_{en}$ goes high. This disables transistors P8, P9 and enables transistor N7. With transistors P8 and P9 disabled, the sense amplifier outputs $SA_{out}$ and $SA_{outB}$ are decoupled from the bit lines BL and $BL_B$. The cross coupled inverters of the sense amplifier 36 comprising the transistors P3, N5 and P4, N6 are now fully enabled by being supplied with $V_{DDP}$ and ground voltage. The sense amplifier 36 quickly amplifies the small differential voltage between $SA_{out}$ and $SA_{outB}$ by drawing $SA_{outB}$ to ground and $SA_{out}$ to $V_{DDP}$. Thus, the small differential voltage that appears between $SA_{out}$ and $SA_{outB}$ when WL is enabled is amplified to the full supply voltage differential by the sense amplifier 36. The I/O circuitry 26 reads the amplified differential voltage from $SA_{out}$ and $SA_{outB}$ thereby reading the value stored in the memory cell 32. If the value stored in the memory cell 32 had been "0", then the sense amplifier would have brought $SA_{out}$ to ground and $SA_{outB}$ to $V_{DDP}$. The I/O circuitry 26 detects this voltage differential and reads the correct value "0" from the sense amplifier 36.

The memory device 20 of FIG. 2 suffers from some limitations. In order to keep to the array supply voltage and the peripheral supply voltage from shorting during the reset phase, the bit lines BL, $BL_B$ are precharged to the peripheral supply voltage $V_{DDP}$. If the bit lines BL, $BL_B$ are precharged to the array supply voltage $V_{DDA}$, then when P6, P7, P8, P9, N10, and N11 are all enabled during the reset phase, $V_{DDA}$ and $V_{DDP}$ would short-circuit and draw a very large current between $V_{DDP}$ and $V_{DDA}$. This large current consumes a large amount of power and can damage the circuitry. Thus, the bit lines are precharged to the peripheral supply voltage $V_{DDP}$ to avoid this short-circuit situation.

However, if the $V_{DDA}$ and $V_{DDP}$ differ by a very large value, then when the bitlines are precharged to $V_{DDP}$ and the wordline is selected, data can be erroneously written to the memory cell 32 thereby corrupting the data in the memory cell 32. Thus if the bit lines are to be pre-charged to the peripheral supply voltage $V_{DDP}$, constraints are placed on the value of $V_{DDP}$. In other words $V_{DDP}$ cannot differ from $V_{DDA}$ by more than a relatively small amount. Thus, in an example in which the memory array 22 is powered by a relatively high voltage $V_{DDA}$ in order to ensure reliability, the acceptable low-end value of the peripheral supply voltage $V_{DDP}$ is somewhat constrained. In other words the peripheral supply voltage $V_{DDP}$ must be somewhat higher than a preferred value for reduced power consumption by the peripheral circuitry. Likewise, in an example in which the array supply voltage $V_{DDA}$ is relatively low, the acceptable high-end value of the peripheral supply voltage $V_{DDP}$ is somewhat constrained. In other words, the peripheral supply voltage $V_{DDP}$ must be somewhat lower than a preferred value for high performance requirements of the peripheral circuitry. Thus, precharging the bit lines the $V_{DDP}$ reduces the available range for the peripheral supply voltage $V_{DDP}$.

BRIEF SUMMARY

One embodiment is a memory device including an array of memory cells powered by an array supply voltage $V_{DDA}$. The memory device further includes peripheral circuitry powered by a peripheral supply voltage $V_{DDP}$. The memory device includes a sense amplifier coupled to the array of memory cells to assist in reading data from the memory cells. A first capacitor is coupled to a first output of the sense amplifier and a first bit line of the memory array. A second capacitor is coupled to a second output of the sense amplifier and a second bit line of the memory array.

During a read operation of the memory array, the bit lines of the memory array are precharged to the array supply voltage $V_{DDA}$. Because the first and second capacitors are coupled between the sense amplifier outputs and the bit lines, there is no risk of short-circuiting the array supply voltage $V_{DDA}$ and the peripheral supply voltage $V_{DDP}$ during the precharge phase of the read operation. Because there is no risk of short-circuiting the array supply voltage $V_{DDA}$ and the peripheral supply voltage $V_{DDP}$, the bit lines can be precharged to the array supply voltage $V_{DDA}$ instead of the peripheral supply voltage $V_{DDP}$. Because the bit lines are precharged to the array supply voltage $V_{DDA}$ there is reduced risk of spuriously writing data to the memory array during a read operation. Because the bit lines are not precharged to the peripheral supply voltage, the peripheral supply voltage is not constrained by the array supply voltage $V_{DDA}$. Thus, the peripheral circuitry of the memory device can be powered by one or more voltages selected from a wide range of peripheral supply voltages $V_{DDP}$.

DETAILED DESCRIPTION

Figure 3:
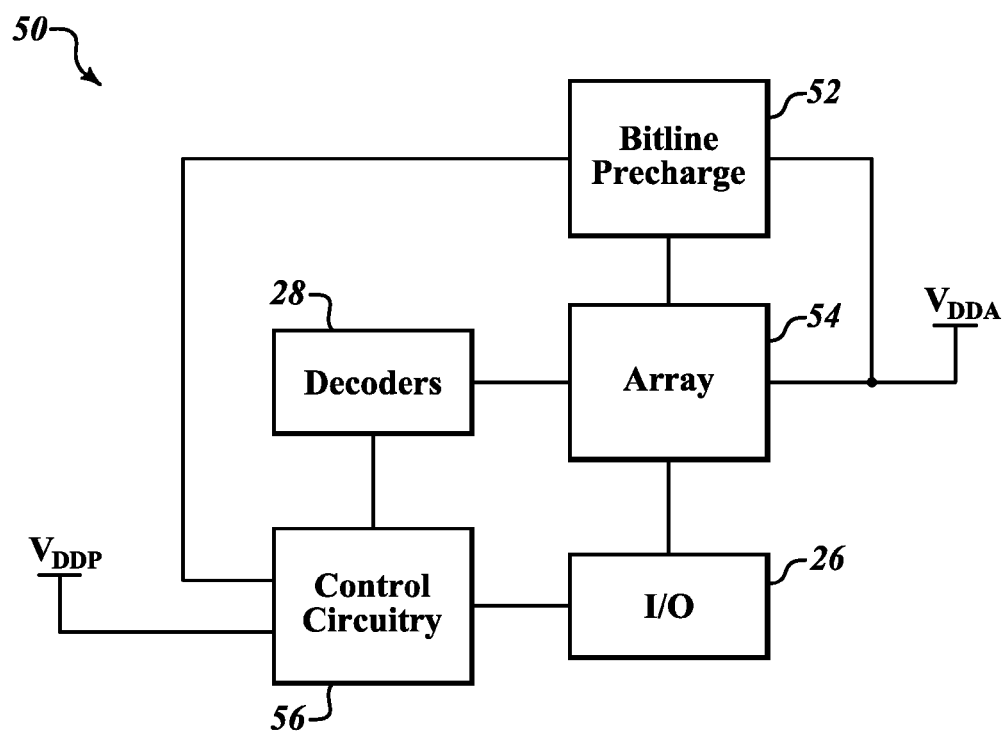
FIG. 3 is a block diagram of a memory device according to one embodiment.

FIG. 3 is a block diagram of the memory device 50 according to one embodiment. The memory device 50 includes an array 54 of memory cells, I/O circuitry 26 coupled to the array 54, decoders 28 coupled to the array 54, and control circuitry 30 coupled to the I/O circuitry 26, decoders 28, and bit line precharge circuit 52. The I/O circuitry 26, control circuitry 56, and decoders 28 all receive a peripheral supply voltage $V_{DDP}$ in accordance with the specific characteristics of the peripheral circuitry. The array 54 and the bit line precharge circuit 52 are powered by an array supply voltage $V_{DDA}$. The array supply voltage $V_{DDA}$ is different than the peripheral supply voltage $V_{DDP}$.

The memory array 54 includes a plurality of memory cells. In a preferred embodiment the memory cells are SRAM memory cells. However, the memory cells can be DRAM, EEPROM, flash RAM, ROM or any other kinds of memory cells. The memory cells of the memory array are disposed in rows and columns. Each column of memory cells is coupled to two bit lines. Thus the memory cells of each column are coupled between the two bit lines that correspond to that column. The memory array also includes word lines. Each word line is coupled to a row of memory cells. Data is written to or read from the memory cells by enabling the proper word line and bit lines according to the address of the memory cells.

In one embodiment, the I/O circuitry 26 includes a sense amplifier coupled to each column of memory cells. When data is read from a memory cell of the memory array, the sense amplifier amplifies a voltage differential between the two bit lines associated with the memory cell. The voltage differential that appears between the two bit lines corresponds to the data value stored in the memory cell. The sense amplifier amplifies is voltage differential and outputs an amplified voltage. The amplified voltage supplied by the sense amplifier corresponds to the value of data stored in the memory cell. The I/O circuitry 26 reads the data from the memory cell based on the amplified voltage supplied by the sense amplifier. A first capacitor is coupled between a first output of the sense amplifier and one of the bit lines. A second capacitor is coupled between a second output of the sense amplifier and the other bit line. As will be explained in more detail below, the presence of the first and second capacitors allows for a wide range of supply voltages to be used in the memory device 20.

The decoders 28 include row decoders and other logic circuits for decoding memory cell addresses. When data is to be read from or written to a memory cell of the memory array 54, a memory cell address is supplied to the decoders 28. The decoders 28 decode the address and enable a word line of the memory array according to the address of the memory cell from which data will be read or to which data will be written. The decoders 28 may also include column decoders that decode a column of the memory cell according to the address of the memory cell. In this case the decoders 28 also enable two bit lines of the memory array 54 in accordance with the address of the memory cell from which data will be read or to which data will be written.

The control circuitry 30 controls the I/O circuitry 26, decoders 28, and bit line precharge 24. The control circuitry 30 is powered by the peripheral supply voltage $V_{DDP}$. The control circuitry 30 provides the peripheral supply voltage $V_{DDP}$ to the decoders 28 and the I/O circuitry 26. Thus, the control circuitry 30, I/O circuitry 26, and decoders 28 are all powered by the peripheral supply voltage $V_{DDP}$. The control circuitry 30 controls all of the components of the memory device 20. When data is to be read from or written to the memory array 54, the control circuitry 30 controls the decoders 28, I/O circuitry 26 and bit line precharge 24. In particular, the control circuitry 30 supplies memory addresses to the decoders 28 and initiates the functions of the I/O circuitry 26.

The control circuitry 30 also causes the bit line precharge 24 to precharge bit lines which will be explained in more detail below.

When data is to be read from the memory array 54, the control circuitry 30 initiates a reset phase during which the bit lines in the memory array are precharged to the array supply voltage $V_{DDA}$. The bit lines are precharged to the array supply voltage $V_{DDA}$ by the bit line precharge circuit 24. The bit line precharge circuit 24 couples the bit lines to the array supply voltage $V_{DDA}$ according to signals from the control circuitry 30. The outputs of the sense amplifier of the I/O circuitry 26 are precharged to the peripheral supply voltage $V_{DDP}$ or another intermediate voltage during the reset phase. Because the output of the sense amplifier is separated from the bit lines of the memory array by the first and second capacitors, the bit lines of the memory array 54 can be precharged to the supply voltage $V_{DDA}$ and the sense amplifier outputs can be precharged to the supply voltage $V_{DDP}$ or to another voltage level without short-circuiting supply voltages during the reset phase. In one alternative embodiment, the bit lines are precharges to $V_{DDX}$, having a value less than $V_{DDA}$, but greater than $V_{DDP}$, for example, halfway between the two voltages of $V_{DDA}$ and $V_{DDP}$.

Because the bit lines are precharged to the array supply voltage $V_{DDA}$ or some other selected voltage instead of the peripheral supply voltage $V_{DDP}$, the value of the peripheral supply voltage $V_{DDP}$ is not constrained by the value of the array supply voltage $V_{DDA}$. Instead, the peripheral supply voltage $V_{DDP}$ can have a very low value compared to the array voltage $V_{DDA}$ in order to minimize power consumption by the peripheral circuitry, or the peripheral supply voltage can have a relatively high voltage compared to the array voltage $V_{DDA}$ in order to maximize performance of the peripheral circuitry. The peripheral supply voltage can also have any value between the high and low values mentioned above. This wide range of peripheral supply voltages is available without the risk of erroneously writing data to the memory array 54 during a read cycle. The presence of the capacitors separating the sense amplifier outputs from the bit lines makes possible the wide range of peripheral supply voltages.

In one embodiment the memory device 20 is integrated circuit die including a semiconductor substrate. The transistors of the memory cells of the memory array 54 are formed at a semiconductor substrate. The transistors of the peripheral circuitry (i.e., the control circuitry 30, decoders 28, and I/O circuitry 26) are also formed a semiconductor substrate. The integrated circuit die includes stacks the dielectric layers in which are formed the various levels conductive interconnection lines, conductive plugs, resistors, capacitors, and other structures common in integrated circuit dies. Alternatively, the memory device 20 includes one or more integrated circuit dies in a package. The memory device 20 can also include one or more packages. Those of skill the art will understand that the memory device 20 can include many configurations and many more features than have been disclosed in relation to FIG. 3.

Figure 4:
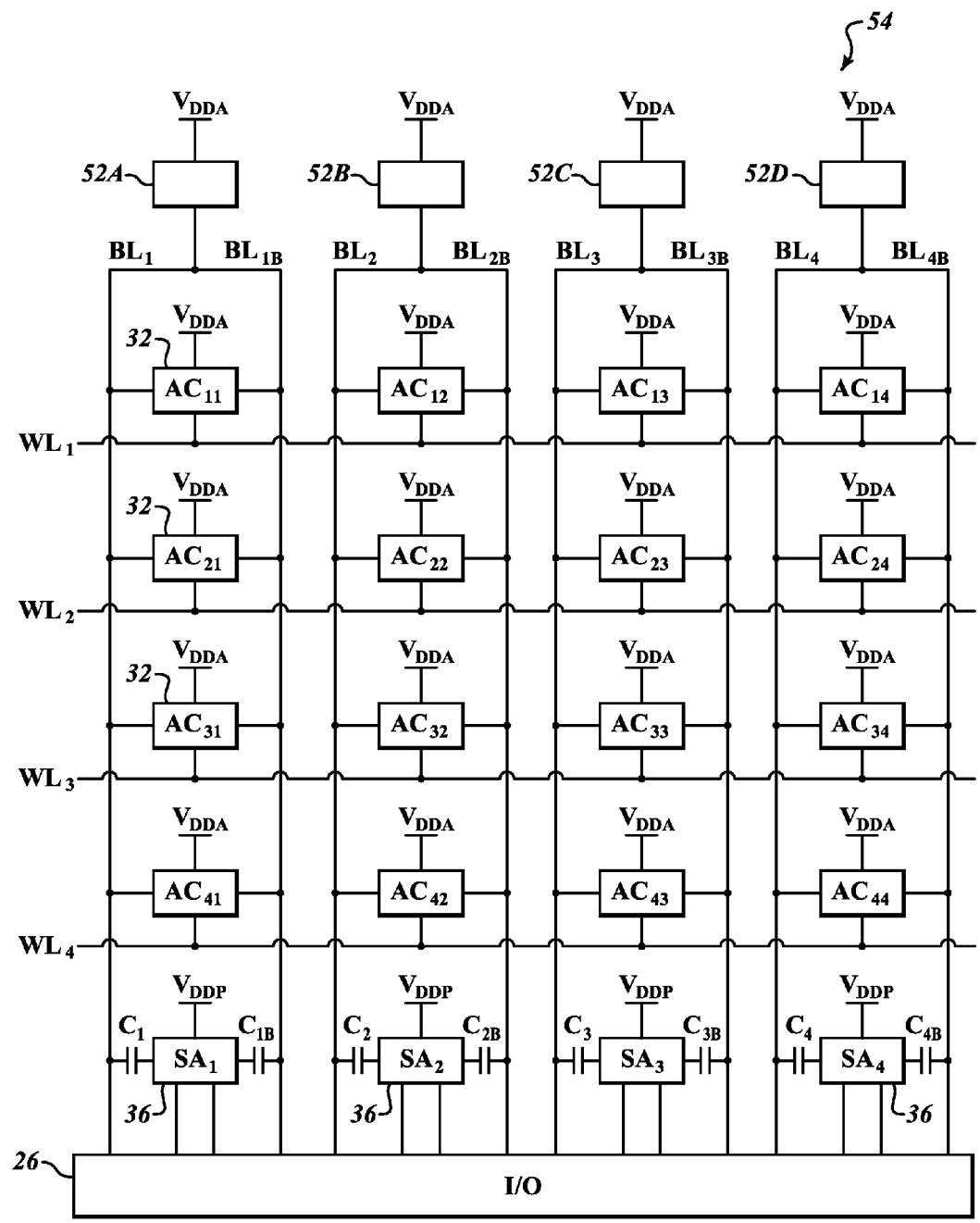
FIG. 4 is a schematic diagram of an array of memory cells according to one embodiment.

FIG. 4 is a simplified schematic diagram of a dual rail SRAM memory array 54 according to one embodiment. The memory 22 includes a plurality of SRAM memory cell 32 disposed in rows and columns. The SRAM memory cells 32 are labeled as array cells $AC_{nm}$ where n denotes the row of the memory cell and m denotes the call of the memory cell. Thus, the memory cell $AC_{11}$ is in the first row and the first column. The memory cell $AC_{44}$ is in the fourth row and the fourth column. While sixteen memory cells are shown in FIG. 4, those of skill the art will understand that the memory array 54 can include many thousands or millions of memory cells divided into various groups such as blocks and sectors.

The memory array 54 further includes a plurality of pairs of bit lines $BL_1$-$BL_{4B}$. Each pair of bit lines is coupled to a column of memory cells 32. For instance, the bit lines $BL_1$ and $BL_{1B}$ are coupled to the first column of memory cells 32 including memory cells $AC_{11}$-$AC_{41}$. The pair of bit lines $BL_1$, $BL_{1B}$ are coupled to precharge circuit 52A. The pair bit lines $BL_2$, $BL_{2B}$ are coupled to precharge circuit 52B. The pair of bit lines $BL_3$, $BL_{3B}$ are coupled to precharge circuit 52C. The pair of bit lines $BL_4$, $BL_{4B}$ are coupled to precharge circuit 52D. The precharge circuits 52A-52D couple the respective pairs of bit lines to the array supply voltage $V_{DDA}$. Each memory cell 32 is coupled between two of the bit lines.

The memory array 54 also includes word lines $WL_1$-$WL_4$. Each word line is coupled to a respective row of memory cells. For instance, the word line $WL_1$ is coupled to the first row of memory cells including $AC_{11}$-$AC_{14}$. The word line $WL_2$ is coupled to the second row of memory cells including $AC_{21}$-$AC_{24}$, and so forth.

The memory array 54 further includes a plurality of sense amplifiers 36 labeled $SA_1$-$SA_4$. Each sense amplifier 36 is coupled between a respective one of the pairs of bit lines corresponding to a column of memory cells. Each sense amplifier 36 includes a pair of capacitors. Each capacitor of the pair is coupled to a respective bit line. For instance, the sense amplifier SA1 is coupled between the bit lines $BL_1$, $BL_{1B}$. The capacitor $C_1$ is coupled between the sense amplifier $SA_1$ and the bit line $BL_1$. The capacitor $C_{1B}$ is coupled between the sense amplifier $SA_1$ and the bit line $BL_{2B}$. Thus, the sense amplifier SA1 corresponds to the first column of memory cells $AC_{11}$-$AC_{41}$. The sense amplifier $SA_2$ is coupled between the bit lines $BL_2$, $BL_{2B}$, and so forth. The sense amplifiers $SA_1$-$SA_4$ are powered by the peripheral supply voltage $V_{DDP}$. Each sense amplifier includes two outputs coupled to the I/O circuitry 26. Although the sense amplifiers 36 are shown as being part of the memory array 32, they may also be considered part of the I/O circuitry 26.

During a read operation of the memory array 54, a reset phase is initiated during which the bit lines $BL_1$-$BL_{4B}$ are precharged to the array supply voltage $V_{DDA}$ by the precharge circuits 52A-52D. During the reset phase, the outputs of the sense amplifiers 36 are also precharged to either the peripheral voltage $V_{DDP}$ or to an intermediate voltage. When the precharging is complete the precharge circuits decouple the bitlines BI1-BL4B from the array supply voltage $V_{DDA}$ and one of the word lines $WL_1$-$WL_4$ is brought high according to the address of the memory cells to be read. For instance, if the first row of memory cells is to be read, then after the reset phase the word line $WL_1$ is brought high. This couples the two outputs of each memory cell $AC_{11}$-$AC_{14}$ to a respective bit line of the pair coupled to that memory cell. Thus, when WL1 is brought high, a first output of the memory cell $AC_{11}$ is coupled to the bit line BL1. The second output of the memory cell $AC_{11}$ is coupled to the bit line $BL_{1B}$. The two outputs of the memory cell $AC_{11}$ have complementary voltages, i.e., if the first output is high and the second output is low. Thus, when WL1 is enabled, a small differential voltage appears across the bit lines BL1, $BL_{1B}$. The sense amplifier $SA_1$ senses this differential voltage via the capacitors $C_1$, $C_{1B}$. The sense amplifier $SA_1$ amplifies the differential voltage and outputs it to the I/O circuitry 26. The amplified voltage across the outputs of the sense amplifier $SA_1$ is indicative of the value stored in the memory cell $AC_{11}$. Because the word line $WL_1$ enables all of the memory cells in the first row, the sense amplifiers $SA_1$-$SA_4$ each supply an amplified voltage signal to the I/O circuitry 26. Thus the I/O circuitry 26 simultaneously reads data from all of the memory cells in the first row when $WL_1$ is enabled.

Because the outputs of the sense amplifiers 36 are separated from the bit lines of the memory array 54 by the pairs of capacitors, the bit lines of the memory array 54 can be precharged to the supply voltage $V_{DDA}$ and the sense amplifier outputs can be precharged to the supply voltage $V_{DDP}$ or to another voltage level without short-circuiting supply voltages during the reset phase. As described previously, this allows the memory device 22 to use a wide range of possible values for the peripheral supply voltage $V_{DDP}$ and the array supply voltage $V_{DDA}$.

Figure 5:
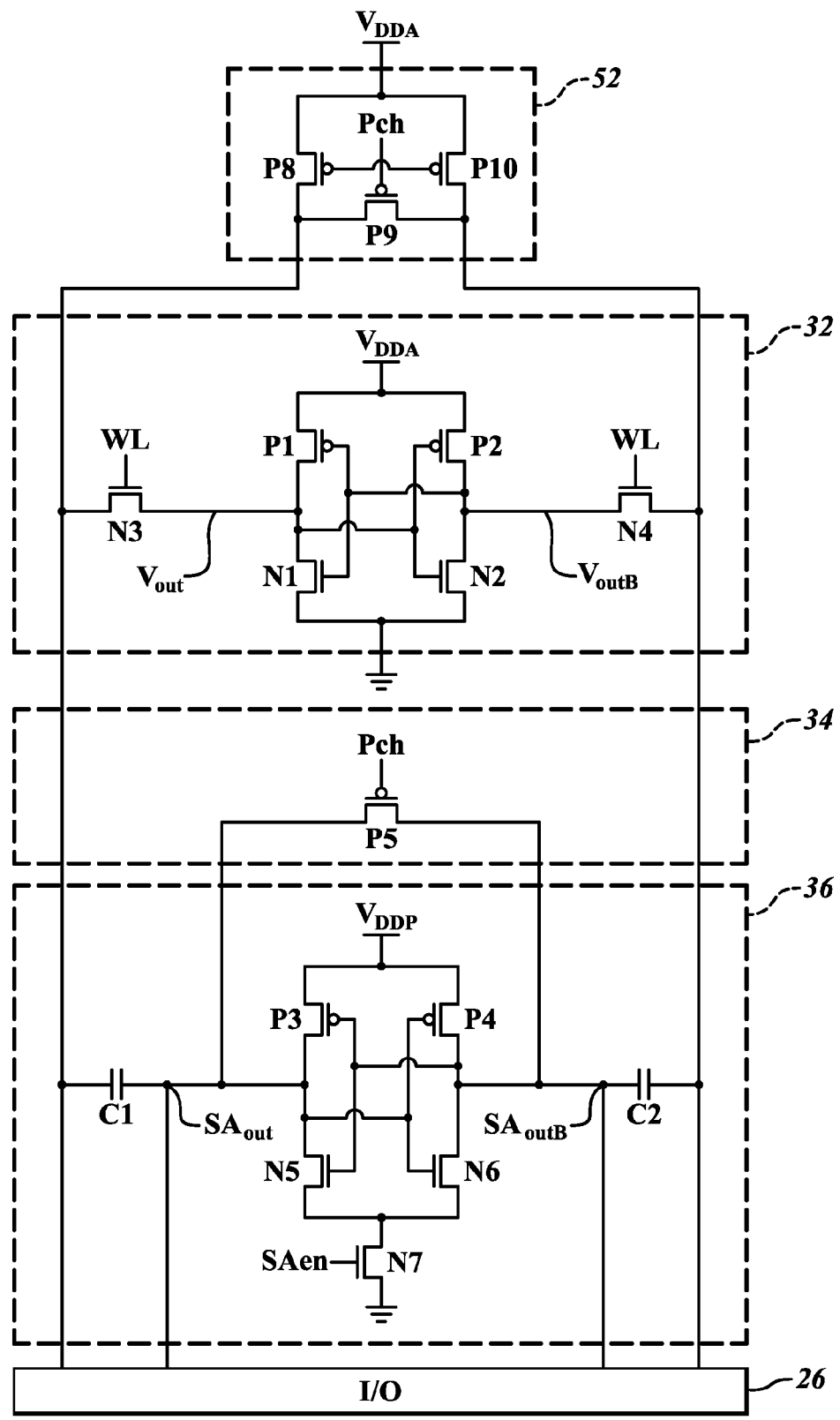
FIG. 5 is a schematic diagram of a portion of a memory device according to one embodiment.

FIG. 5 is a schematic diagram of a portion of a dual rail Static Random Access Memory (SRAM) device 20 according to one embodiment. The dual rail SRAM memory device 20 includes an SRAM memory cell 32 coupled between two bit lines BL, $BL_B$. The bit lines BL, $BL_B$ are coupled between the array supply voltage $V_{DDA}$ and the I/O circuitry 26. A sense amplifier 36 is coupled to the I/O circuitry 26 and to the bit lines BL, $BL_B$. A first capacitor $C_1$ has a first electrode connected to the output of the sense amp, $SA_{out}$ and the other electrode coupled to the bit line, BL. A second capacitor $C_2$ has a first electrode connected to the sense amplifier output $SA_{outB}$ and the other electrode connected to the bit line $BL_B$. A sense amplifier precharge circuit 34 is coupled to the sense amplifier 36. As will be described in more detail herein, the presence of the capacitors $C_1$, $C_2$ provides a number of benefits to the memory device 20.

In a preferred embodiment, the electrodes of the capacitors $C_1$ and $C_2$ are directly connected to the respective outputs $SA_{out}$ and $SA_{outB}$ with no components between them. Similarly, in a preferred embodiment, the other electrode of each capacitor is directly connected to the respective bit line, BL and $BL_B$, with nothing between them.

The memory cell 32 includes a first inverter comprised of PMOS transistor P1 and NMOS transistor N1. The memory cell 32 includes a second inverter comprised of PMOS transistor P2 and NMOS transistor N2. The gates of the transistors P1 and N1 are coupled together and comprise the input of the first inverter. The source of the transistor P1 is coupled to the array supply voltage $V_{DDA}$. The source of the transistor N1 is coupled to ground. The drain terminals of the transistors P1 and N1 are coupled together and comprise the output $V_{out}$ of the first inverter. The gates of the transistors P2 and N2 coupled together and comprise the input of the second inverter. The source of the transistor P2 is coupled to the array supply voltage $V_{DDA}$. The source of the transistor N2 is coupled to ground. The drain terminals of the transistors P2 and N2 are coupled together and comprise the output $V_{outB}$ of the second inverter. The first and second inverters are cross coupled together in a latch configuration such that the output $V_{out}$ of the first inverter is coupled to the input of the second inverter. The output $V_{outB}$ of the second inverter is coupled to the input of the first inverter. This ensures that the output $V_{out}$ of the first inverter will be the logical opposite of the output $V_{outB}$ of the second inverter and vice versa. Thus, if the output $V_{out}$ of the first inverter is at ground, the output $V_{outB}$ of the second inverter is at $V_{DDA}$. If the output $V_{out}$ of the first inverter is at $V_{DDA}$, the output $V_{outB}$ of the second inverter is at ground. The output $V_{out}$ of the first inverter is coupled to the bit line BL via an access transistor N3. The output $V_{outB}$ is of the second inverter is coupled to the bit line $BL_B$ via an access transistor N4. The access transistors N3 and N4 are coupled to a word line WL and are enabled when an enable signal is present on the word line WL.

The sense amplifier 36 also includes two inverters cross coupled in a latch configuration. The first sense amplifier inverter includes the transistors P3 and N5. The second sense amplifier inverter includes the transistors P4 and N6. The output of the first sense amplifier inverter is $SA_{out}$. The output of the second sense amplifier inverter is $SA_{outB}$. The inverter outputs $SA_{out}$, $SA_{outB}$ are the first and second outputs of the sense amplifier 36. The first and second sense amplifier outputs are coupled to the bit lines BL and $BL_B$ via capacitors $C_1$, $C_2$ and to I/O circuitry 26. The sources of the transistors N5 and N6 are coupled to ground via the access transistor N7. The transistor N7 is enabled when the sense amplifier enable signal $SA_{en}$ is high.

The sense amplifier precharge circuit 34 includes a single precharge transistor P5. The gate of the precharge transistor P5 receives the precharge enable signal Pch. The transistor P5 is enabled when the precharge enable signal Pch is low, forcing $SA_{out}$ and $SA_{outB}$ to a same equalized Q-point voltage.

The bitline precharge circuit 52 includes precharge transistors P8-P10 that couple the bitlines BL, $BL_B$ to the array supply voltage $V_{DDA}$.

An example of a read cycle of the memory cell 32 will now be provided. In this example, a binary "1" is stored in the memory cell 32. This means that the first memory cell output $V_{out}$ is at $V_{DDA}$ while the second memory cell output $V_{outB}$ is at ground.

When data is to be read from the memory cell 32 a reset phase is initiated in which both bit lines BL and $BL_B$ are precharged to the array supply voltage $V_{DDA}$ by enabling the transistors P8-P10 via the precharge signal Pch. During the reset phase the precharge enable signal Pch is maintained at ground, thereby precharging $SA_{out}$, $SA_{outB}$ to the same equalized Q-point voltage. During the reset phase $SA_{en}$ is at ground. Thus, during the reset phase the transistor N7 is off.

After the bit lines BL, $BL_B$ and the sense amplifier outputs $SA_{out}$, $SA_{outB}$ are precharged to the equalized Q-point voltage, the word line WL goes high and the transistors N3 and N4 are enabled. When WL goes high, Pch goes high, disabling the transistors P5, P8-P10. The bit lines BL, $BL_B$ are decoupled from the array supply voltage $V_{DDA}$. The sense amplifier outputs $SA_{out}$ and $SA_{outB}$ are decoupled from each other. When the word line WL first goes high, $SA_{en}$ is still at ground. Thus, the transistor N7 is still off when the word line WL first goes high.

With the transistors N3 and N4 enabled, the outputs $V_{out}$, $V_{outB}$ of the memory cell 32 are connected to the bit lines BL and $BL_B$ respectively. Because the $V_{out}$ is at the array supply potential $V_{DDA}$, the voltage on the bit line BL remains at $V_{DDA}$. Because $V_{outB}$ is at ground, the voltage on the bit line $BL_B$ begins to decrease toward ground. Thus, a differential voltage begins to appear cross the bit lines BL, $BL_B$.

Due to the nature of capacitors, the voltage across the plates in the capacitor $C_1$ and across the plates of the capacitor $C_2$ cannot instantaneously change. Thus, as the voltage on $BL_B$ begins to drop a similar voltage drop is forced onto the sense amplifier output $SA_{outB}$. Because the voltage on the bit line BL remains at the array supply voltage $V_{DDA}$, the voltage at the sense amplifier output does not change. Because the voltage on the sense amplifier output $SA_{outB}$ begins to decrease, a differential voltage appears across $SA_{out}$ and $SA_{outB}$.

A short time after WL is enabled, $SA_{en}$ goes high. This enables transistor N7. The cross coupled inverters of the sense amplifier 36 comprising the transistors P3, N5 and P4, N6 are now fully enabled by being supplied with $V_{DDP}$ and the ground voltage. The sense amplifier 36 quickly amplifies the small differential voltage between $SA_{out}$ and $SA_{outB}$ by drawing $SA_{outB}$ to ground and $SA_{out}$ to $V_{DDP}$. Thus, the small differential voltage that appears between $SA_{out}$ and $SA_{outB}$ when WL is enabled is amplified to the full supply voltage differential by the sense amplifier 36. The I/O circuitry 26 reads the amplified differential voltage from $SA_{out}$ and $SA_{outB}$ thereby reading the value stored in the memory cell 32. If the value stored in the memory cell 32 had been "0", then the sense amplifier would have brought $SA_{out}$ to ground and $SA_{outB}$ to $V_{DDP}$. The I/O circuitry 26 detects this voltage differential and reads the correct value "0" from the sense amplifier 36.

Because the output of the sense amplifier is separated from the bit lines of the memory array by the first and second capacitors, the bit lines of the memory array 54 can be precharged to the supply voltage $V_{DDA}$ and the sense amplifier outputs can be precharged to the supply voltage $V_{DDP}$ or to another voltage level without short-circuiting supply voltages during the reset phase.

Because the bit lines are precharged to the array supply voltage $V_{DDA}$ instead of the peripheral supply voltage $V_{DDP}$, the value of the peripheral supply voltage $V_{DDP}$ is not constrained by the value of the array supply voltage $V_{DDA}$. Instead, the peripheral supply voltage $V_{DDP}$ can have a very low value compared to the array voltage $V_{DDA}$ in order to minimize power consumption by the peripheral circuitry, or the peripheral supply voltage can have a relatively high voltage compared to the array voltage $V_{DDA}$ in order to maximize performance of the peripheral circuitry. The peripheral supply voltage can also have any value between the high and low values mentioned above. This wide range of peripheral supply voltages is available without the risk of erroneously writing data to the memory array 54 during a read cycle. The presence of the capacitors separating the sense amplifier outputs from the bit lines makes possible the wide range of peripheral supply voltages.

In one embodiment, the capacitors $C_1$, $C_2$ are MIM capacitors formed in the dielectric stack of an integrated circuit die. In particular, one terminal of the capacitor is formed in a first metal layer of an integrated circuit die, a second terminal of the capacitor is formed in a second metal layer of the integrated circuit die. A dielectric layer separates the two metal layers. The capacitor plates can be formed of Al, Cu, Ti, W, Au, polysilicon, another suitable conductive material or an alloy of the aforementioned materials.

Figure 1:
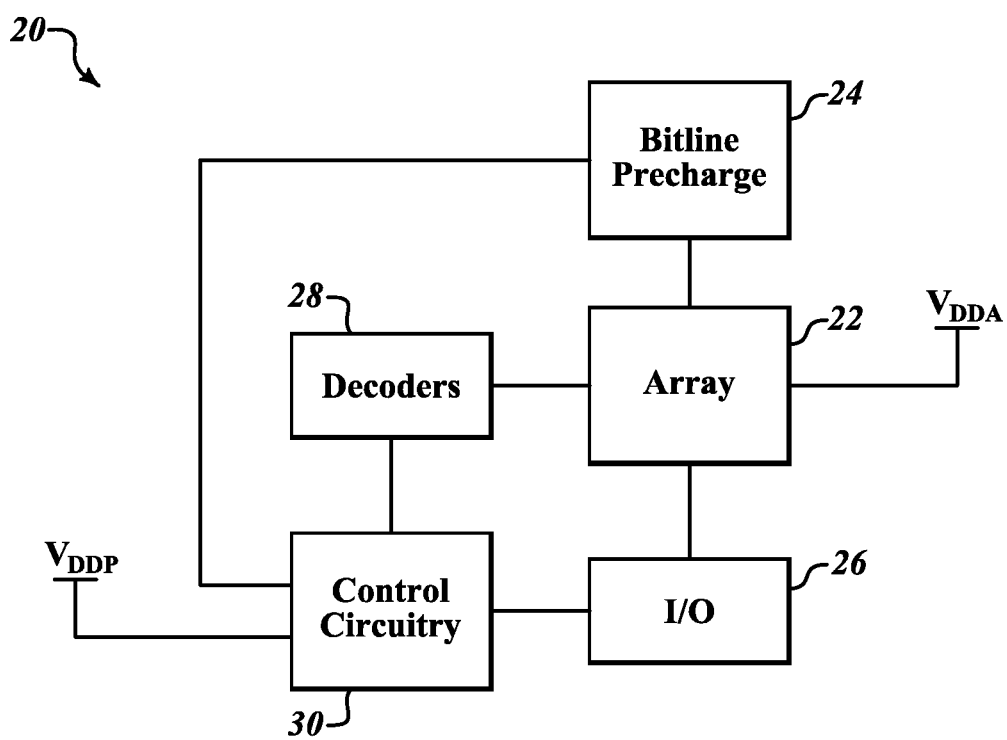
FIG. 1 is a block diagram of a conventional memory device.
Figure 2:
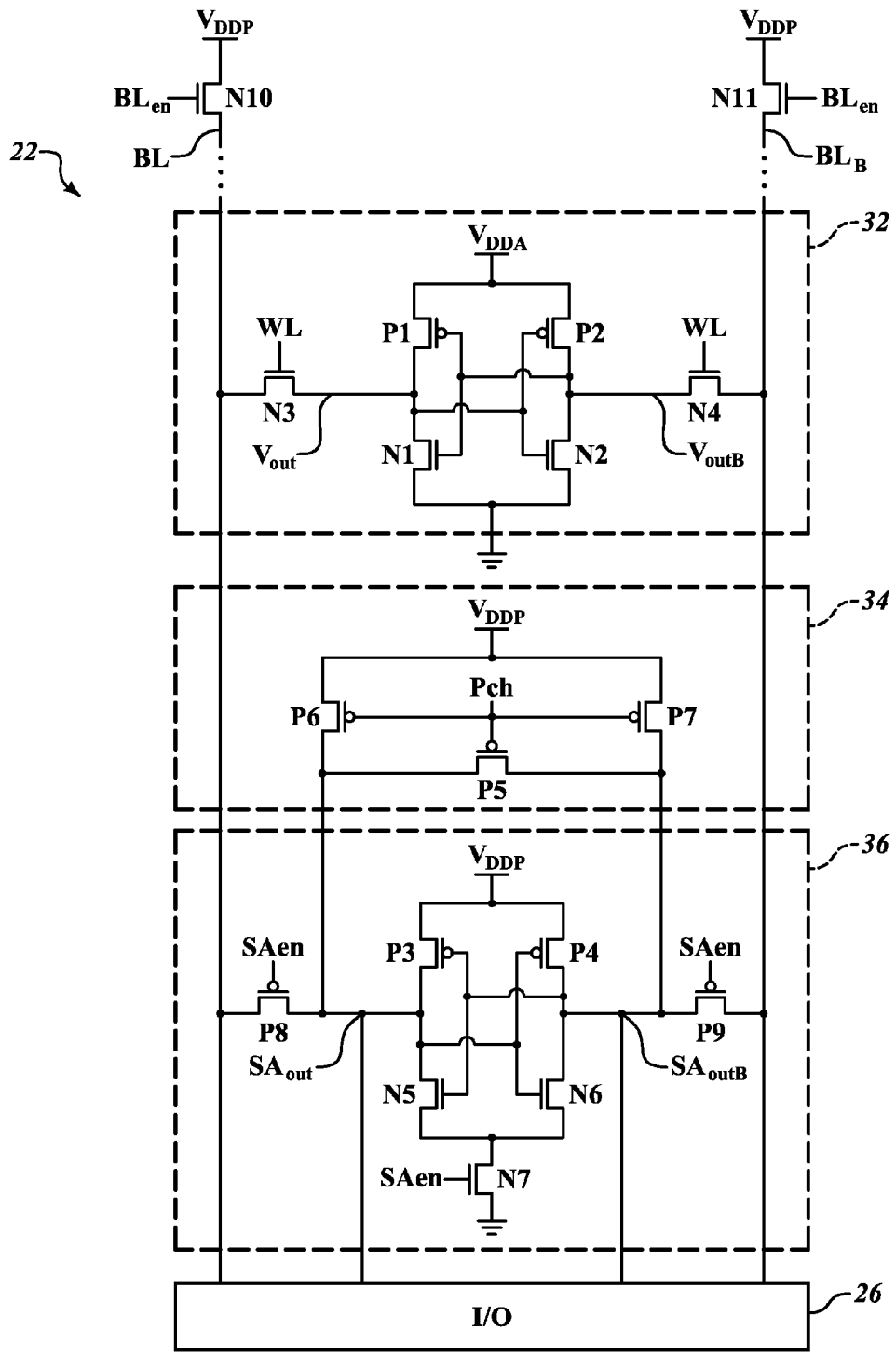
FIG. 2 is a schematic diagram of a portion of a conventional memory array.
Figure 6:
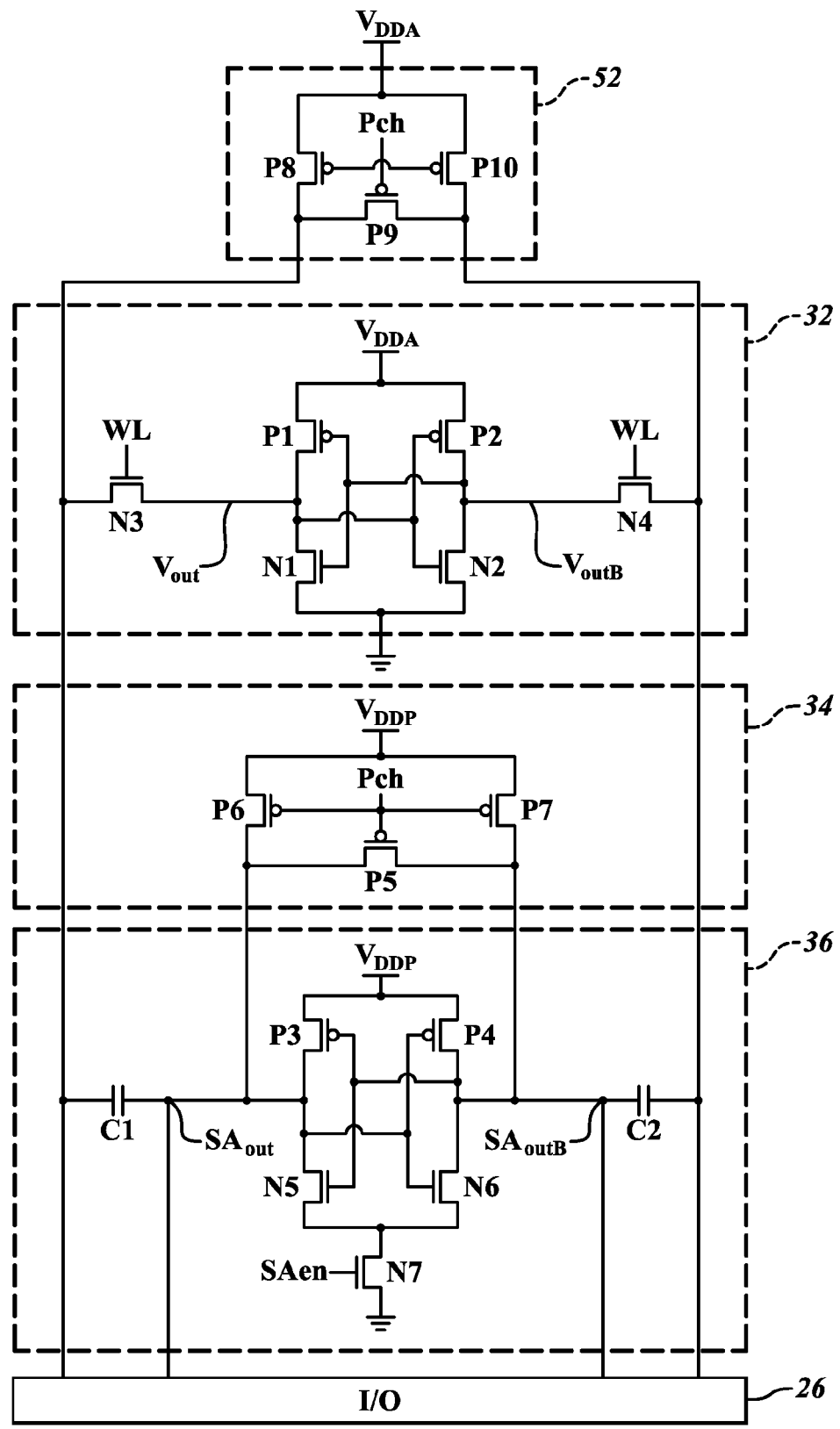
FIG. 6 is a schematic diagram of a portion of a memory device according to one embodiment.

FIG. 6 is a schematic diagram of a portion of a memory device 20 according to one embodiment. The memory device 20 of FIG. 6 is substantially similar to the memory device 20 FIG. 5 except that the precharge circuit 34 of the memory device of FIG. 6 is identical to the precharge circuit 34 of FIG. 2. Thus, during the reset phase of a read operation, the sense amplifier outputs $SA_{out}$, $SA_{outB}$ are precharged to the peripheral voltage supply $V_{DDP}$. Aside from the difference in the precharge circuit 34, the function of the memory device 20 of FIG. 6 is similar to that of FIG. 5.

Figure 7:
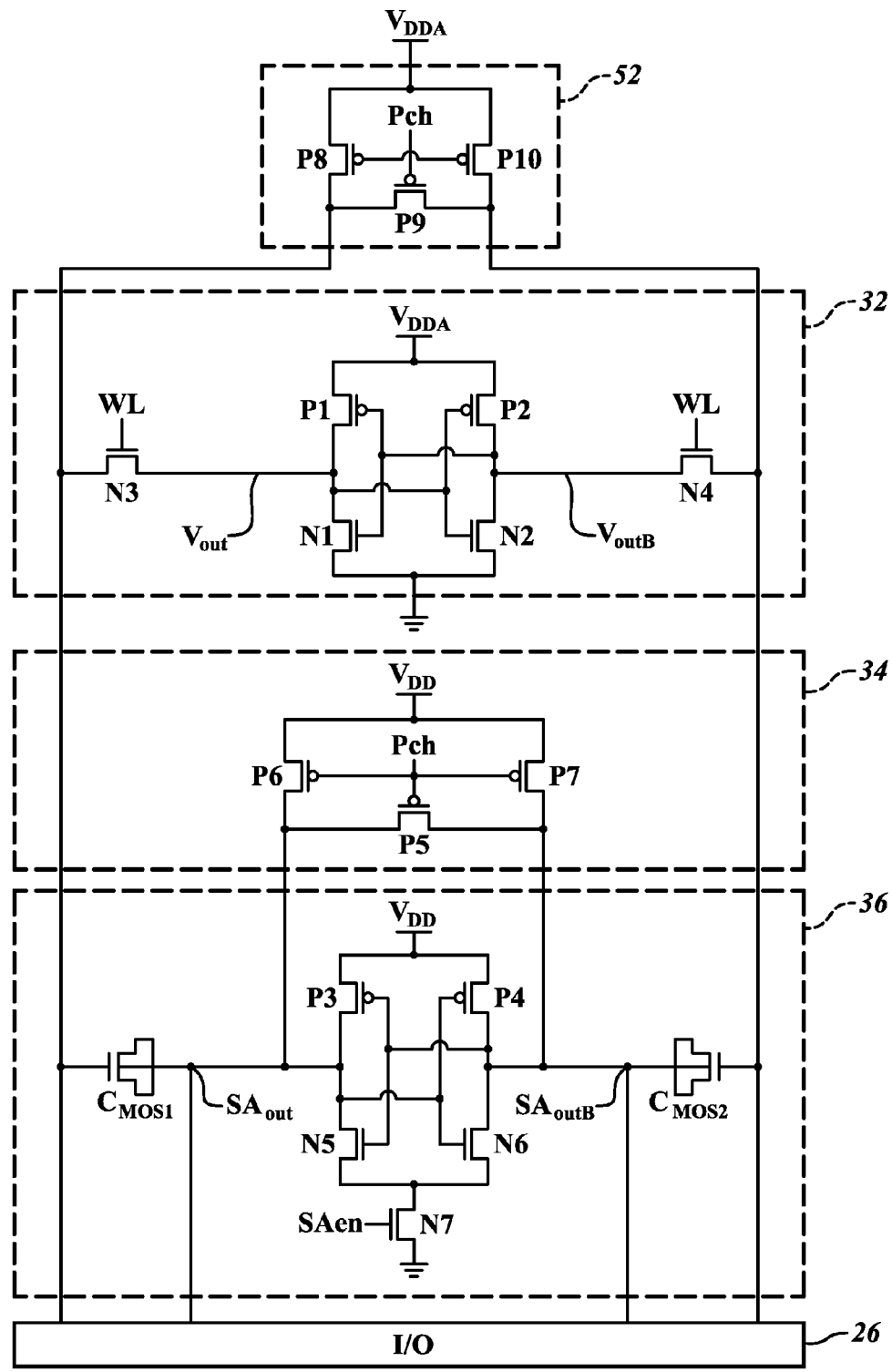
FIG. 7 is a schematic diagram of a portion of a memory device according to one embodiment.

FIG. 7 is a schematic diagram of a portion of a memory device 20 according to one embodiment. The memory device 20 of FIG. 7 is substantially similar to the memory device 20 FIG. 6. However, in FIG. 7 the capacitors $C_{MOS1}$ and $C_{MOS2}$ are coupled between $SA_{out}$, BL and $SA_{outB}$, $BL_B$. $C_{MOS1}$ and $C_{MOS2}$ are MOS capacitors. The gate of the MOS capacitor $C_{MOS1}$ is coupled to BL. The source, drain, and bulk terminals of $C_{MOS1}$ are coupled to $SA_{out}$. The gate of the MOS capacitor $C_{MOS2}$ is coupled to BL. The source, drain, and bulk terminals of $C_{MOS2}$ are coupled to $SA_{outB}$. No current can pass between BL and $SA_{out}$. Likewise, no current can pass between $BL_B$ and $SA_{outB}$. The function of the memory device 20 of FIG. 7 is similar to that of FIG. 6.

The present invention can also be used with memory cells that have a single bit line coupled from the memory cell to the sense amplifier and a reference bit line, also called a dummy bit line, coupled to the other input of the sense amplifier. The type of memory cells that have this connection include DRAMs, ROMs, some types of EEPROMs and FLASH, and other memory cells. When a dummy bit line is used, the reference input to the sense amp 36 is generated independently, as is well known in the art. While it is generally known to provide dummy bit lines as the other input to a sense amplifier for those types of memory cells that have a single bit line as the output, it is not known that each of the data bit line and the dummy bit line will have a capacitor positioned between them and the sense node of the sense amplifier. Since the use of dummy bit lines per se is well known and how this invention would be applied to sense amplifiers for memory cells with a single bit line has been described in detail herein, a specific figure is not provided, but easily could be based on the description herein if the Examiner deems it necessary. Namely, the dummy bit line, with its associated capacitor would be provided as the other input to the sense amplifier instead of another bit line from the memory cell.

Figure 8:
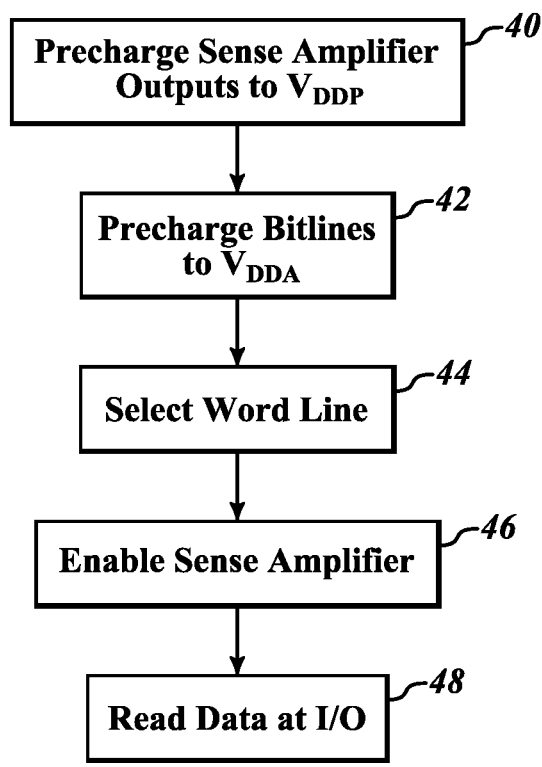
FIG. 8 is a flowchart illustrating a read operation of a memory cell according to one embodiment.

FIG. 8 is a flowchart of a process for reading data from the dual rail SRAM memory cell. At 40, sense amplifier outputs $SA_{out}$, $SA_{outB}$ are precharged to the peripheral supply voltage $V_{DDP}$. At 42, the bit lines are precharged to the array supply voltage $V_{ADA}$. At 44, the word line WL is enabled, thereby coupling the output of the memory cell 32 to the bit lines BL, $BL_B$. This causes a differential voltage to appear across the bit lines BL, $BL_B$. Shortly after WL is enabled, the sense amplifier 36 is enabled. When the sense amplifier 36 is enabled, the sense amplifier 36 amplifies the small differential voltage and outputs and amplified differential voltage to I/O circuitry 26. At 48, the I/O circuitry 26 reads the data from the memory cell based on the amplified differential voltage supply by the sense amplifier 36.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a memory cell coupled between a high voltage supply and a low voltage supply;
a first bit line coupled to the memory cell;
a second bit line;
a sense amplifier coupled to the first and the second bit line, the sense amplifier having a first output and a second output;
a first capacitor coupled directly between the first output and the first bit line; and
a second capacitor coupled directly between the second output and the second bit line.

2. The device of claim 1 comprising a first precharge circuit coupled to the first and the second bit line and configured to charge the first and the second bit line to the high supply voltage prior to a read operation of the memory cell.

3. The device of claim 2 comprising a second precharge circuit coupled to the first and the second output and configured to charge the first and the second outputs to a precharge voltage level prior to the read operation of the memory cell.

4. The device of claim 3 wherein the precharge circuit charges the first and the second outputs to a voltage level between the high and low supply voltages.

5. The device of claim 1 comprising a word line coupled to the memory cell and configured to enable the memory cell to supply a first memory cell voltage to the first bit line and a second memory cell voltage to the second bit line during a read operation of the memory cell.

6. The device of claim 5 wherein during the read operation the sense amplifier amplifies a difference between the first and second memory cell voltages.

7. The device of claim 6 comprising a data read circuit coupled to the first and the second bit line and configured to read data from the memory cell based on the amplified difference between the first and second memory cell voltages.

8. The device of claim 1 wherein the first capacitor is the gate and drain or gate and source terminals of a first MOS transistor.

9. The device of claim 8 wherein the second capacitor is the gate and drain or gate and source terminals of a second MOS transistor.

10. The device of claim 1 wherein the memory cell is an SRAM memory cell and the second bit line is a data bit line that provides a data value.

11. The device of claim 1 wherein the second bit line is a dummy bit line that provides a reference voltage as the input.

12. The device of claim 11 wherein the sense amplifier includes an access transistor configured to couple the latch to the low supply voltage during a read operation of the memory cell.

13. A device, comprising:
address circuitry powered by a first high supply voltage;
an array of memory cells coupled to the address circuitry and powered by a second high supply voltage, the array including:
a plurality of columns of memory cells;
a plurality of pairs of bit lines, each pair of bit lines being coupled to a respective column of memory cells;
a plurality of sense amplifiers each coupled to a respective column of memory cells and a respective pair of bit lines and each including:
a first output and a second output;
a first capacitor having a first electrode coupled to the first output and a second electrode coupled to a first bit line of the pair of bit lines; and
a second capacitor having a first electrode coupled to the second output and a second electrode coupled to a second bit line of the respective pair of bit lines;
a data read circuit configured to read data from the array of memory cells.

14. The device of claim 13 comprising a first precharge circuit configured to charge the pairs of bit lines to the second high supply voltage prior to a memory read operation.

15. The device of claim 14 comprising a plurality of second precharge circuits each coupled to a respective sense amplifier and configured to charge the first and second outputs to a precharge voltage level prior to a memory read operation.

16. The device of claim 15 wherein the first and second capacitors are each gate-drain or gate-source capacitors of respective MOS transistors.

17. The device of claim 15 wherein the electrodes of the first and capacitors are metal.

18. The device of claim 13 comprising decoding circuitry coupled between each sense amplifier and the respective pair of bitlines.

19. A method for reading data from a memory cell, the method comprising:
- precharging a bit line to a first high supply voltage;
- coupling the memory cell to the bit line by supplying an enable signal to a word line coupled to the memory cell, the memory cell being powered by the first high supply voltage and a low supply voltage;
- precharging an output of a sense amplifier to a precharge voltage; and
- amplifying a voltage difference between the bitline and a reference voltage by supplying an enable signal to the sense amplifier, a capacitor being coupled between the output and the bit line.

\* \* \* \* \*